United States Patent
He et al.

(10) Patent No.: US 9,054,020 B2
(45) Date of Patent: Jun. 9, 2015

(54) DOUBLE DENSITY SEMICONDUCTOR FINS AND METHOD OF FABRICATION

(71) Applicant: International Business Machines Corporation, Armonk, NY (US)

(72) Inventors: Hong He, Niskayuna, NY (US); Chiahsun Tseng, Wynantskill, NY (US); Chun-Chen Yeh, Clifton Park, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 13/686,969

(22) Filed: Nov. 28, 2012

(65) Prior Publication Data

US 2014/0145295 A1    May 29, 2014

(51) Int. Cl.
*H01L 21/76* (2006.01)
*H01L 29/16* (2006.01)
*H01L 21/308* (2006.01)

(52) U.S. Cl.
CPC ............ *H01L 29/16* (2013.01); *H01L 21/3086* (2013.01)

(58) Field of Classification Search
CPC ............... H01L 21/823821; H01L 21/845; H01L 27/0886; H01L 29/785
USPC ......... 438/149, 150, 164, 413, 424, 478, 479, 438/481, 595
See application file for complete search history.

(56) References Cited

U.S. PATENT DOCUMENTS

| 6,894,337 B1 | 5/2005 | Wang et al. | |
|---|---|---|---|
| 2004/0262687 A1* | 12/2004 | Jung et al. | 257/347 |
| 2005/0239242 A1 | 10/2005 | Zhu et al. | |
| 2007/0065990 A1 | 3/2007 | Degroote et al. | |
| 2007/0298593 A1* | 12/2007 | Yu et al. | 438/479 |
| 2008/0111184 A1* | 5/2008 | Beintner et al. | 257/327 |
| 2011/0193141 A1 | 8/2011 | Lin et al. | |
| 2012/0126883 A1 | 5/2012 | Juengling | |
| 2013/0119482 A1* | 5/2013 | Wann et al. | 257/401 |
| 2013/0277760 A1* | 10/2013 | Lu et al. | 257/401 |

OTHER PUBLICATIONS

Bencher, Christopher; "An Assessment of Patterning Options for 15nm Half-Pitch"; 2011 International Symposium on VLSI Technology, Systems and Applications; DOI: 10.1109/VTSA.2011.5872262. Print ISBN: 978-1-4244-8493-5.*
Bencher, Christopher; An Assessment of Patterning Options for 15nm Half-Pitch; IEEE; 2011.

* cited by examiner

*Primary Examiner* — Meiya Li
*Assistant Examiner* — Peter M Albrecht
(74) *Attorney, Agent, or Firm* — Howard M. Cohn; H. Daniel Schnurmann (57) ABSTRACT

Methods and structures having increased fin density are disclosed. Structures with two sets of fins are provided. A lower set of fins is interleaved with an upper set of fins in a staggered manner, such that the lower set of fins and upper set of fins are horizontally and vertically non-overlapping.

4 Claims, 11 Drawing Sheets

DOUBLE DENSITY SEMICONDUCTOR FINS AND METHOD OF FABRICATION

FIELD OF THE INVENTION

The present invention relates generally to semiconductor fabrication, and more particularly to fin structures and methods of fabrication.

BACKGROUND OF THE INVENTION

With the continuing trend towards miniaturization of integrated circuits (ICs), there is a need for transistors to have higher drive currents with increasingly smaller dimensions. The use of semiconductor fins is becoming more prevalent as device size continues to shrink. Fin devices, such as fin field effect transistors (FinFETs), fin diodes, and fin resistors enable increased circuit density, which is beneficial for various electronic circuits, such as those utilized in SRAM devices. It is therefore desirable to have improved fin structures and methods of fabrication to support increased circuit density.

SUMMARY OF THE INVENTION

In one embodiment, a semiconductor structure is provided. The structure comprises a semiconductor substrate, a first insulator layer disposed on the semiconductor substrate, a first set of semiconductor fins disposed on the first insulator layer, a second insulator layer disposed in between fins of the first set of semiconductor fins, and a second set of semiconductor fins disposed on the second insulator layer.

In another embodiment, a method of forming a semiconductor structure is provided. The method comprises forming a first set of fins on a first insulator layer of a semiconductor-on-insulator structure, and forming a second set of fins on a second insulator layer, wherein the second insulator layer is disposed in between fins of the first set of fins.

In another embodiment, a method of forming a semiconductor structure is provided. The method comprises depositing a nitride layer over a semiconductor-on-insulator layer of a semiconductor-on-insulator structure, depositing a resist layer over the nitride layer, patterning the resist layer to form patterned resist regions, depositing a conformal oxide layer over the patterned resist regions, recessing the conformal oxide layer to expose a top portion of the patterned resist regions, removing the patterned resist regions, forming cavities in the nitride layer and semiconductor-on-insulator layer, removing the conformal oxide layer, forming a blanket oxide layer, recessing the blanket oxide layer below the top of the semiconductor-on-insulator layer, growing an epitaxial semiconductor layer which is in contact with the semiconductor-on-insulator layer, and extends to the top of the nitride layer, removing the nitride layer, and separating the epitaxial semiconductor layer and semiconductor-on-insulator layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAILED DESCRIPTION

Figure 1:
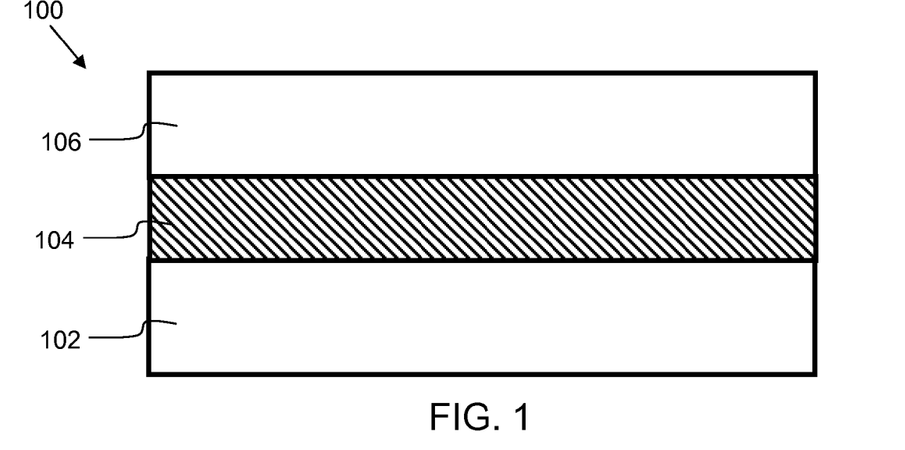
FIG. 1 is a semiconductor structure at a starting point for embodiments of the present invention.

FIG. 1 is a semiconductor structure 100 at a starting point for embodiments of the present invention. Semiconductor structure 100 comprises a semiconductor substrate 102. Semiconductor substrate 102 may comprise any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments, semiconductor substrate 102 is "bulk" silicon, such as that provided by a wafer or die.

Insulator layer 104 is disposed on semiconductor substrate 102. Insulator layer 104 may be comprised of oxide, and may be referred to as a buried oxide (BOX) layer. Semiconductor-on-insulator (SOI) layer 106 is disposed on insulator layer 104. SOI layer 106 may comprise any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. In some embodiments, SOI layer 106 has a thickness ranging from about 50 nanometers to about 200 nanometers.

Figure 2:
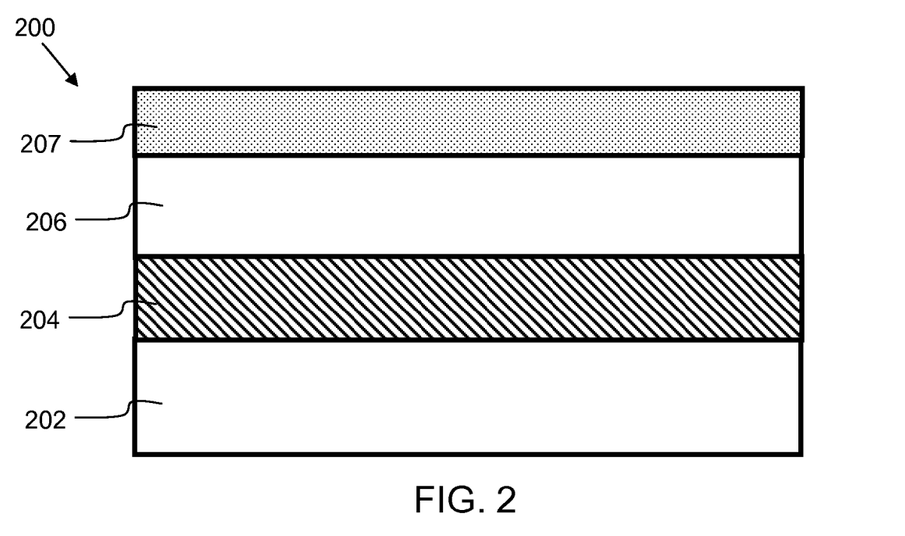
FIG. 2 is a semiconductor structure after a subsequent process step of blanket nitride deposition.

FIG. 2 is a semiconductor structure 200 after a subsequent process step of blanket nitride deposition. Nitride layer 207 may be deposited via any suitable technique, such as chemical vapor deposition (CVD). As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. In some embodiments, nitride layer 207 has a thickness ranging from about 50 nanometers to about 200 nanometers.

Figure 3:
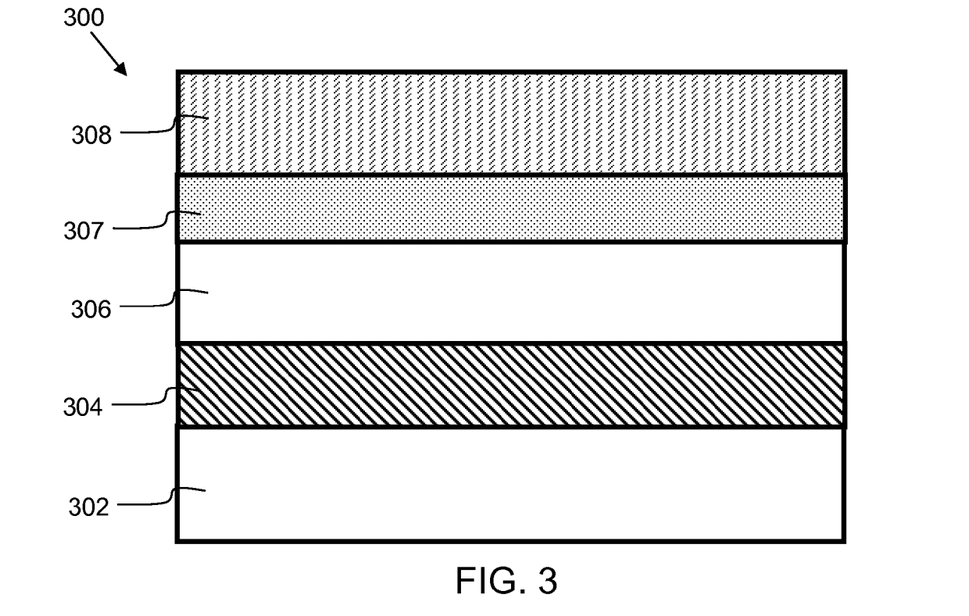
FIG. 3 is a semiconductor structure after a subsequent process step of blanket photoresist deposition.

FIG. 3 is a semiconductor structure 300 after a subsequent process step of blanket photoresist deposition. Photoresist layer 308 is deposited over the nitride layer 307.

Figure 4:
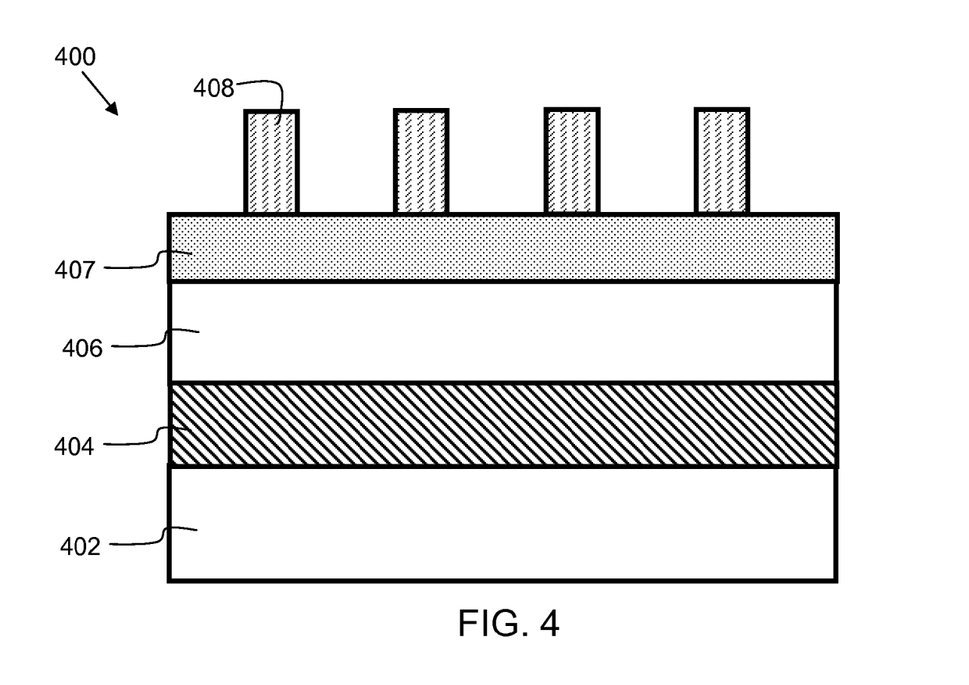
FIG. 4 is a semiconductor structure after a subsequent process step of photoresist patterning.

FIG. 4 is a semiconductor structure 400 after a subsequent process step of photoresist patterning. The patterning may be performed using industry-standard lithographic and patterning techniques. As a result of the patterning, resist regions 408 remain disposed on nitride layer 407.

Figure 5:
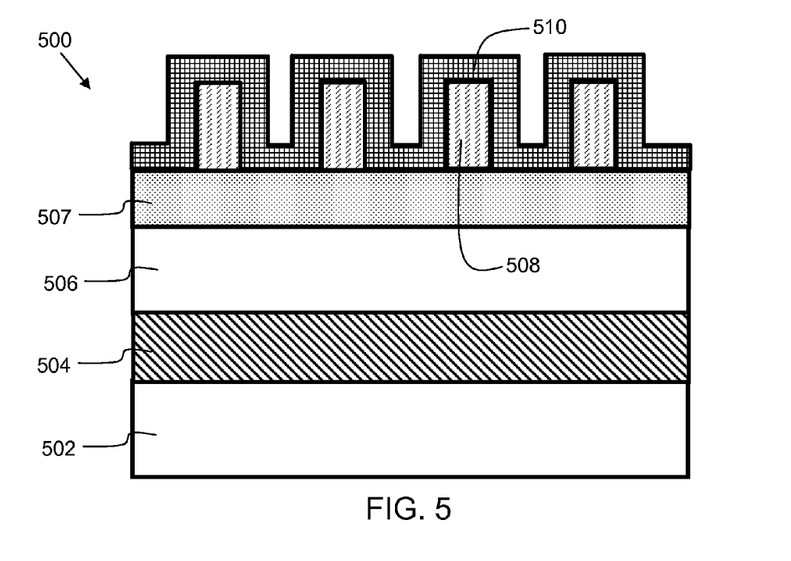
FIG. 5 is a semiconductor structure after a subsequent process step of depositing a first oxide layer.

FIG. 5 is a semiconductor structure 500 after a subsequent process step of depositing a first oxide layer 510. Oxide layer 510 is a conformal oxide layer, conforming to the resist regions 508. Oxide layer 510 may be a low temperature oxide. In some embodiments, the oxide layer 510 is deposited at a temperature ranging from about 500 degrees Celsius to about 750 degrees Celsius.

Figure 6:
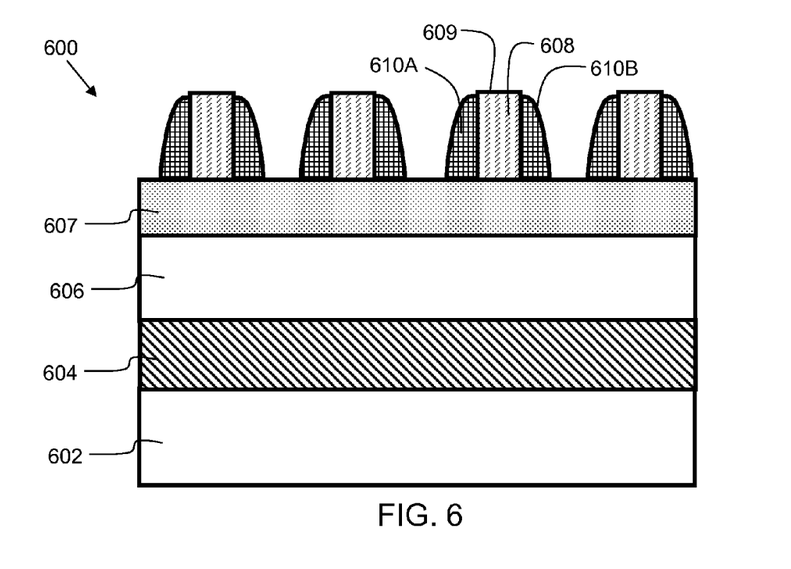
FIG. 6 is a semiconductor structure after a subsequent process step of recessing the first oxide layer.

FIG. 6 is a semiconductor structure 600 after a subsequent process step of recessing the first oxide layer. As a result of the recess, spacers 610A and 610B formed from the first oxide layer are disposed adjacent to resist region 608. The top 609 of resist region 608 is exposed as a result of the recess. In some embodiments, the recess is performed with an anisotropic etch, such as a reactive ion etch.

Figure 7:
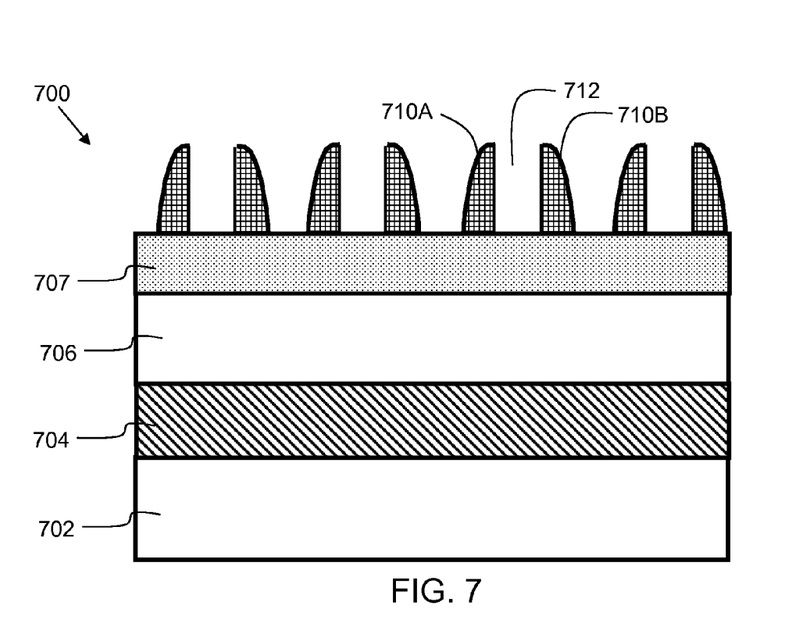
FIG. 7 is a semiconductor structure after a subsequent process step of removing the photoresist.

FIG. 7 is a semiconductor structure 700 after a subsequent process step of removing the photoresist. The photoresist may be removed using industry-standard methods. As a result of the photoresist removal, oxide spacers 710A and 710B remain, with cavity 712 between spacers 710A and 710B, where the photoresist previously occupied (compare with FIG. 6).

Figure 8:
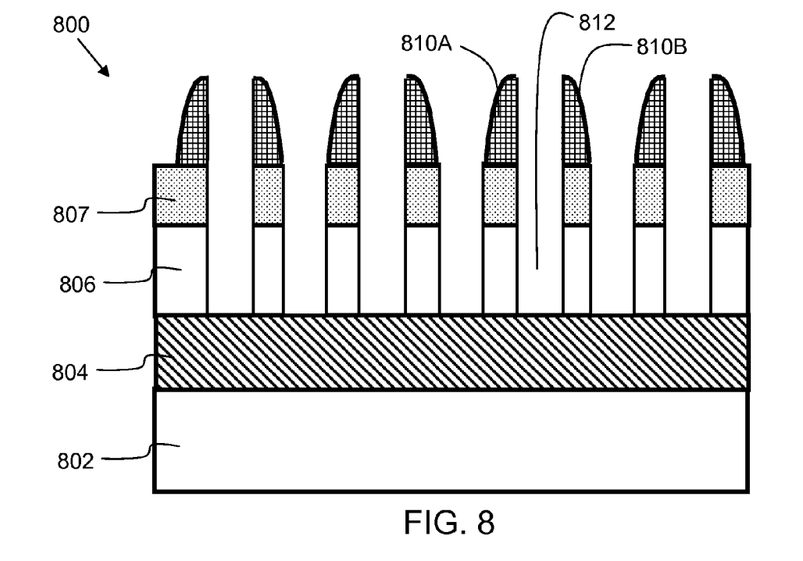
FIG. 8 is a semiconductor structure after a subsequent process step of performing a recess to the level of the insulator layer.

FIG. 8 is a semiconductor structure 800 after a subsequent process step of performing a recess to the level of the insulator layer 804. The recess affects areas not covered by spacers 810A and 810B. In those areas not covered by spacers 810A and 810B, the nitride layer 807 is removed, and the SOI layer 806 is also removed, exposing insulator 804. In some embodiments, the recess may be performed in two separate steps, where one step is for recessing nitride layer 807, and another step is for recessing SOI layer 806. In other embodiments, the nitride layer 807 and SOI layer 806 may be removed in a single step, and may use an etchant that etches both the nitride layer 807 and the SOI layer 806 in a similar manner.

Figure 9:
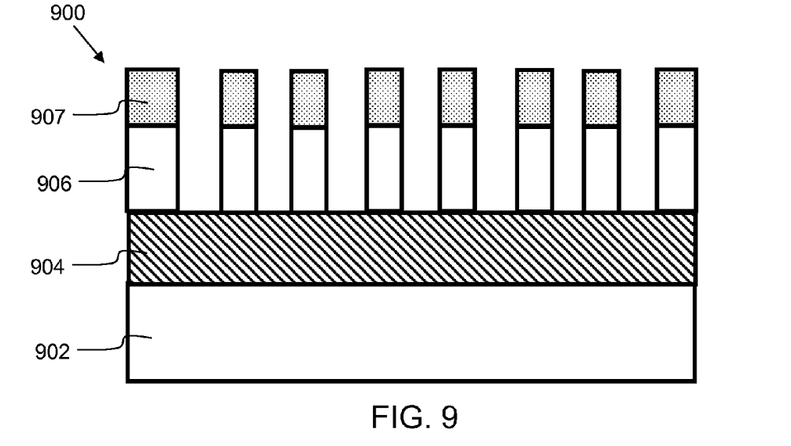
FIG. 9 is a semiconductor structure after a subsequent process step of removing the first oxide layer.

FIG. 9 is a semiconductor structure 900 after a subsequent process step of removing the first oxide layer. The remaining portion of the first oxide layer (spacers 810A and 801B of FIG. 8), is now removed. In one embodiment, the first oxide layer is removed with a chemical mechanical polish (CMP) process. In another embodiment, a selective wet chemical etch process is used to remove the first oxide layer.

Figure 10:
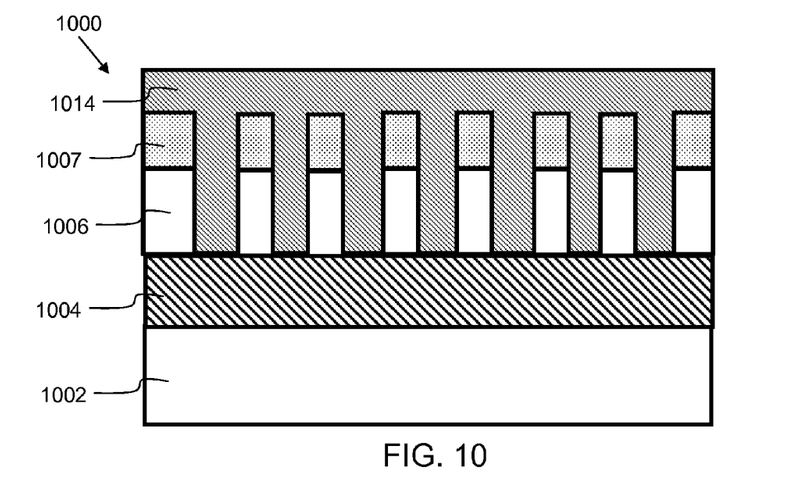
FIG. 10 is a semiconductor structure after a subsequent process step of depositing a second oxide layer.

FIG. 10 is a semiconductor structure 1000 after a subsequent process step of depositing a second oxide layer 1014. The second oxide layer 1014 is a blanket oxide layer. In some embodiments, a flowable oxide process is used for forming second oxide layer 1014. The flowable oxide process may include chemical vapor deposition.

Figure 11:
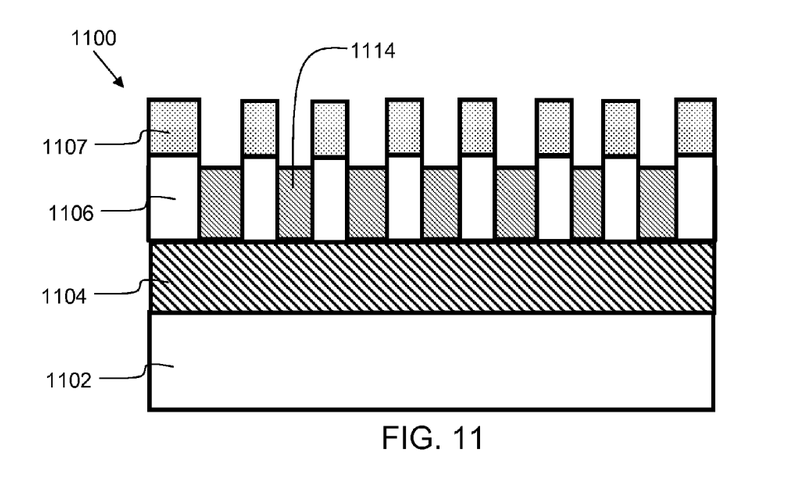
FIG. 11 is a semiconductor structure after a subsequent process step of recessing the second oxide layer.

FIG. 11 is a semiconductor structure 1100 after a subsequent process step of recessing the second oxide layer 1114. The second oxide layer is recessed to a level below the SOI layer 1106. In some embodiments, the recess process utilizes an anisotropic etch process, such as a reactive ion etch. In other embodiments, a wet chemical etch process may be used.

Figure 11A:
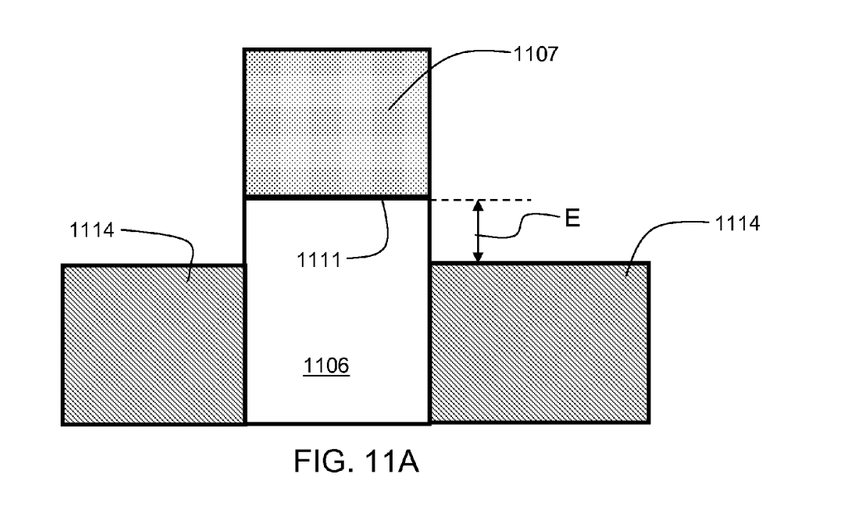
FIG. 11A shows details of FIG. 11, indicating the exposing of the semiconductor material.

FIG. 11A shows details of FIG. 11, indicating the exposing of the SOI layer region 1106. As can be seen in FIG. 11A, portions of the second oxide layer 1114 are on each side of SOI layer region 1106. The second oxide regions 1114 are recessed to a depth E below the top 1111 of SOI layer region 1106, creating exposed SOI region 1117. In some embodiments, depth E ranges from about 5 nanometers to about 30 nanometers. A purpose of forming exposed SOI region 1117 of the SOI layer region 1106 is to promote epitaxial growth in an upcoming process step.

Figure 12:
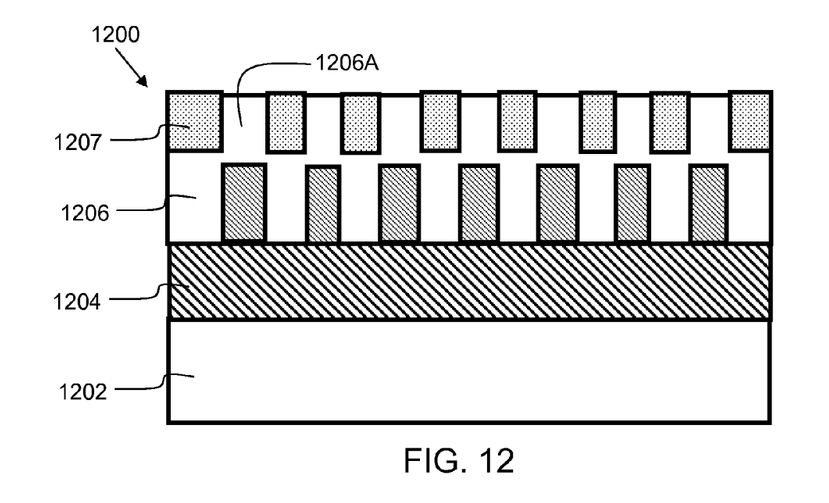
FIG. 12 is a semiconductor structure after a subsequent process step of forming an epitaxial semiconductor region.

FIG. 12 is a semiconductor structure 1200 after a subsequent process step of forming an epitaxial semiconductor region 1206A. Epitaxial semiconductor region 1206A is epitaxially grown from SOI layer 1206, such that SOI layer 1206 and epitaxial semiconductor region 1206A are in direct physical contact with each other, and form a contiguous region. In some embodiments, the epitaxial semiconductor region 1206A may be in-situ doped. In some embodiments, the dopants for epitaxial semiconductor region 1206A may comprise arsenic, phosphorous, or boron.

Figure 12A:
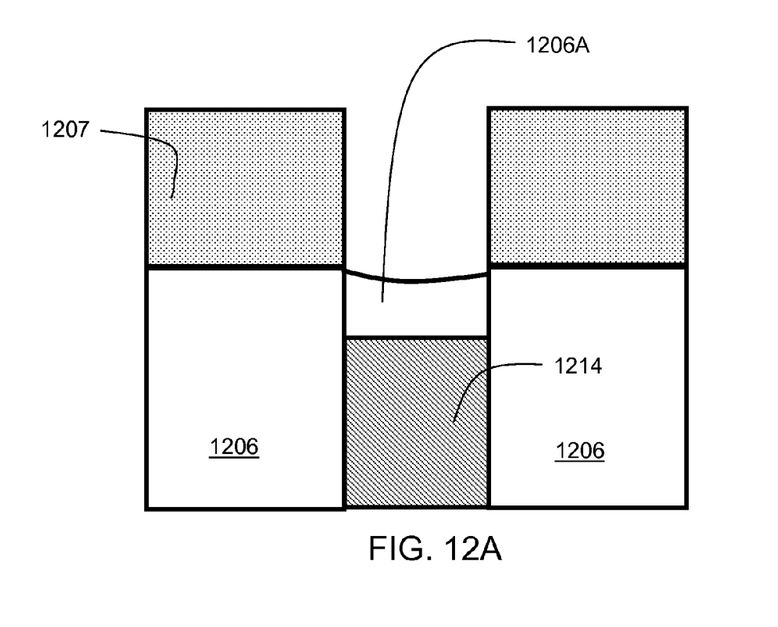
FIGS. 12A-12C show details of the formation of the epitaxial semiconductor region.
Figure 12B:
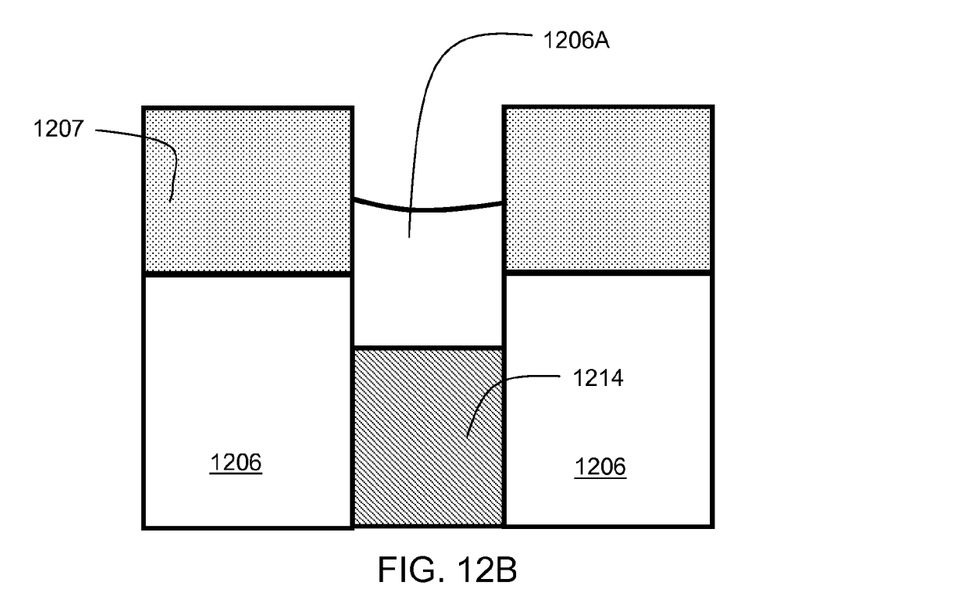
Figure 12C:
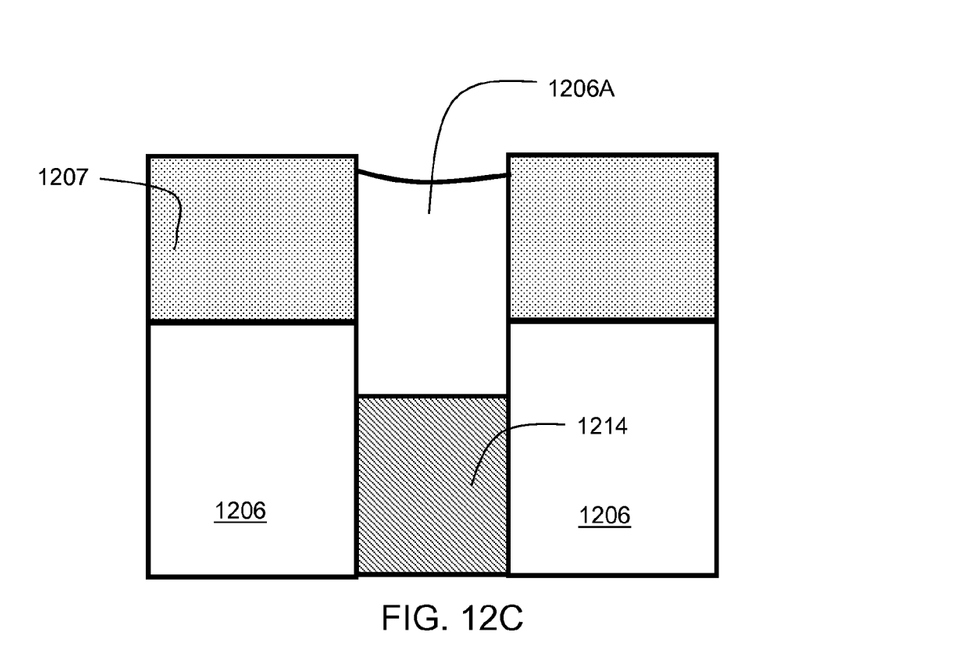

FIGS. 12A-12C show details of the formation of epitaxial semiconductor region 1206A. FIG. 12A shows initial growth of epitaxial semiconductor region 1206A, which forms between two SOI layer regions 1206. FIG. 12B shows epitaxial semiconductor region 1206A after additional growth, and FIG. 12C shows epitaxial semiconductor region 1206A after completed growth. Optionally, the epitaxial semiconductor region may be grown above the nitride layer 1207 in an "overfill" condition, and may then subsequently be planarized to the level of the nitride layer 1207.

Figure 13:
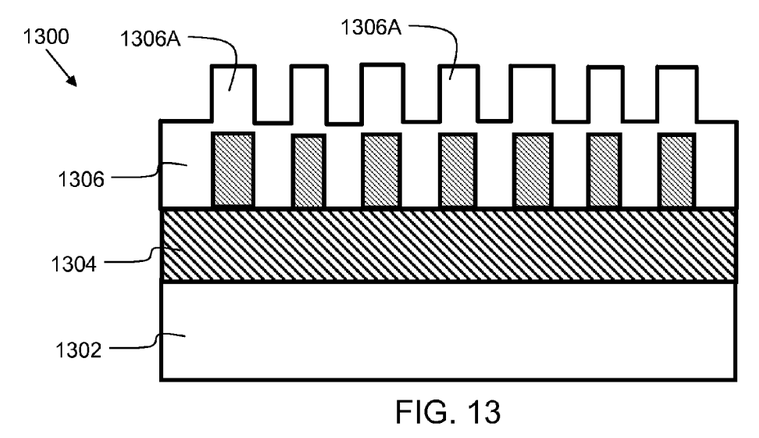
FIG. 13 is a semiconductor structure after a subsequent process step of nitride removal.

FIG. 13 is a semiconductor structure 1300 after a subsequent process step of nitride removal. The nitride regions (1207 of FIG. 12) may be removed via a selective etch process. At this point, the semiconductor structure 1300 comprises a first set of fins 1306 on a lower level of the structure, and a second set of fins 1306A on an upper level of the structure. The two sets of fins are staggered and self-aligned, such that the two sets of fins are vertically non-overlapping (meaning the vertical edges of the lower and upper fins do not overlap). As shown in FIG. 13, the two sets of fins are currently horizontally overlapping (meaning that the top horizontal edge of the lower fins and the lower horizontal edge of the upper fins overlap) and in direct physical contact with each other. The two sets of fins are separated in a subsequent processing step by performing a semiconductor recess.

Figure 14:
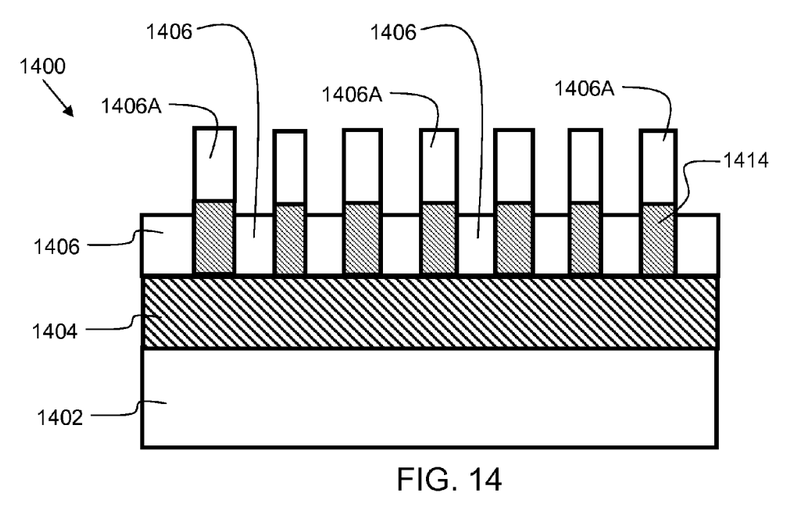
FIG. 14 is a semiconductor structure after a subsequent process step of separating the two sets of fins.

FIG. 14 is a semiconductor structure 1400 after a subsequent process step of separating the two sets of fins. The separation is performed by recessing the semiconductor material of region 1406 and 1406A of the semiconductor structure. This causes region 1406 to recede below the base of region 1406A, hence separating the structures into two separate sets of fins which are horizontally non-overlapping as well as vertically non-overlapping. Region 1406 represents the lower set of fins, and region 1406A represents the upper set of fins. The each fin of the lower set of fins 1406 is separated from one another by an oxide region 1414. From this point forward, additional processing, such as deposition of dielectric layers, fin merging, and other operations may be used to complete fabrication of a device with increased fin density.

Figure 14A:
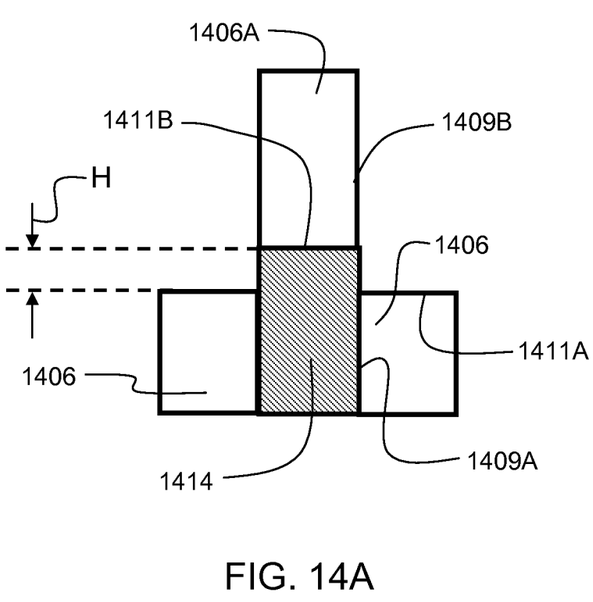
FIG. 14A shows details of the semiconductor structure of FIG. 14.

FIG. 14A shows details of semiconductor structure 1400. Two lower fins 1406 are shown with an oxide region 1414 disposed in between them. An upper fin 1406A is disposed on the top of oxide region 1414. The upper fin 1406A is vertically non-overlapping with lower fins 1406 such that edge 1409B does not extend to the right of edge 1409A. The upper fin 1406a is horizontally non-overlapping such that lower edge 1411B of upper fin 1406A does not extend below upper edge 1411A of lower fin 1406. There is a distance H between the lower edge 1411B of upper fin 1406A and the upper edge 1411A of lower fin 1406. In some embodiments, the distance H ranges from about 10 nanometers to about 30 nanometers.

Figure 15:
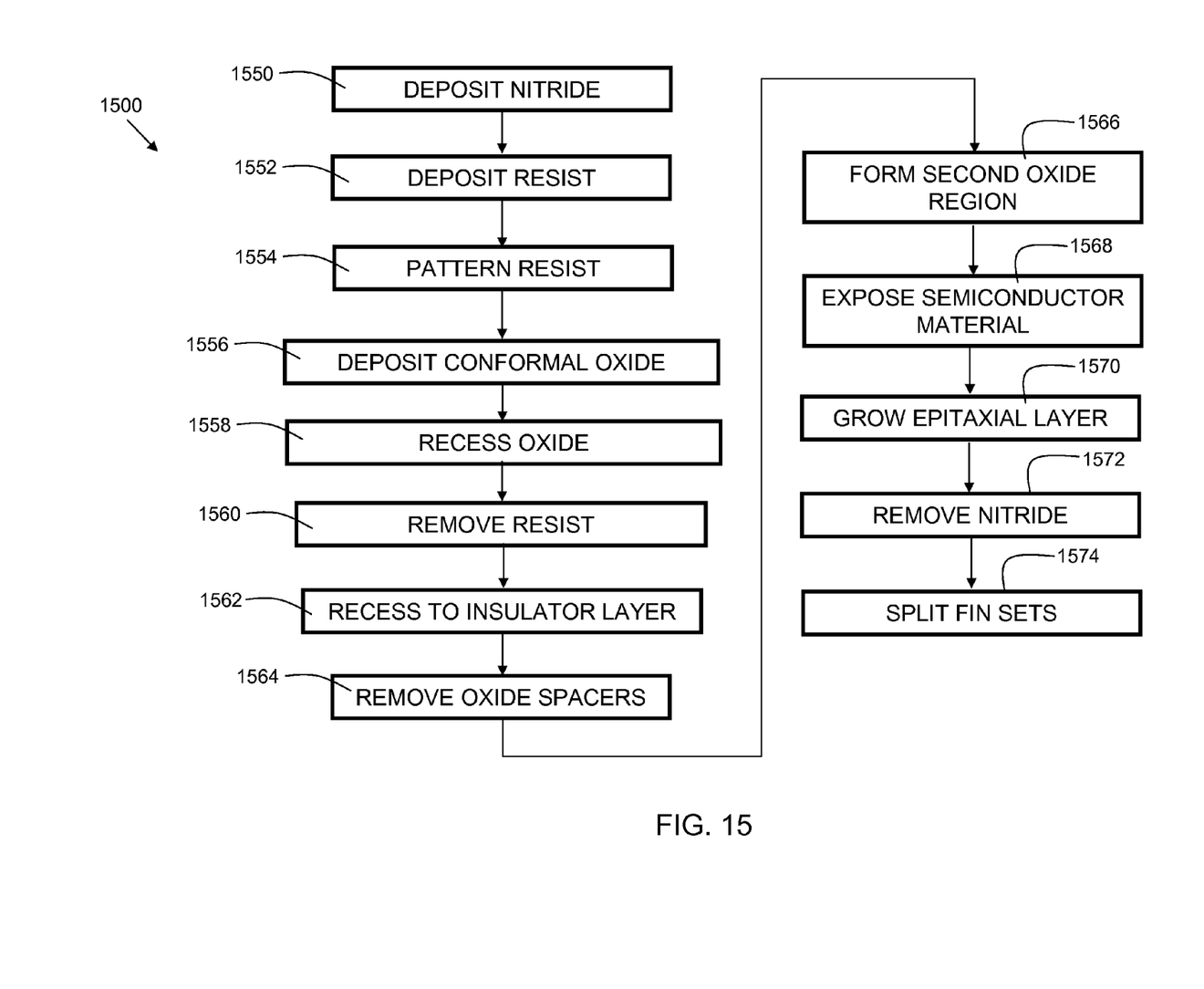
FIG. 15 is a flowchart indicating process steps for embodiments of the present invention.

FIG. 15 is a flowchart indicating process steps for embodiments of the present invention. In process step 1550, a nitride layer is blanket deposited over the semiconductor structure (see 207 of FIG. 2). In process step 1552, a resist layer is blanket deposited over the nitride layer (see 308 of FIG. 3). In process step 1554, the nitride layer is patterned into fin shapes (see 408 of FIG. 4). In process step 1556, a conformal oxide layer is deposited over the fin-shaped resist regions (see 510 of FIG. 5). In process step 1558, the conformal oxide layer is recessed to expose the tops of the fin-shaped resist regions and form spacers (see 610A and 610B of FIG. 6). In process step 1560, the resist region is removed, leaving a cavity between the oxide spacers (see 712 of FIG. 7). In process step 1562, the structure is recessed to the insulator layer, extending the depth of the cavities (see 812 of FIG. 8). In process step 1564, the oxide spacers are removed from the semiconductor structure (see 900 of FIG. 9). In process step 1566, a second oxide region is deposited over the semiconductor structure (see 1014 of FIG. 10). In process step 1568, the second oxide region is recessed to expose a portion of the semiconductor material (see 1114 of FIG. 11). In process step 1570, an epitaxial semiconductor layer is grown over the semiconductor structure (see 1206A of FIG. 12). In process step 1572, the nitride layer is removed from the semiconductor structure (see 1300 of FIG. 13). In process step 1574, the fins are split into a lower set of fins and an upper set of fins (see 1406 and 1406A of FIG. 14).

Embodiments of the present invention provide for methods and structures having increased fin density. Structures with two sets of fins are provided. A lower set of fins is interleaved with an upper set of fins in a staggered manner, such that the lower set of fins and upper set of fins are horizontally and vertically non-overlapping.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, comprising:
    depositing a nitride layer over a semiconductor-on-insulator layer, wherein the semiconductor-on-insulator layer is disposed on a buried oxide (BOX) layer;
    depositing a resist layer over the nitride layer;
    patterning the resist layer to form patterned resist regions;
    depositing a conformal oxide layer over the patterned resist regions;
    recessing the conformal oxide layer to expose a top portion of the patterned resist regions;
    removing the patterned resist regions;
    forming cavities in the nitride layer and the semiconductor-on-insulator layer, wherein the cavities extend to the BOX layer;
    removing the conformal oxide layer;
    forming a blanket oxide layer;
    recessing the blanket oxide layer below a top surface of the semiconductor-on-insulator layer;
    growing an epitaxial semiconductor layer on the semiconductor-on-insulator layer, wherein the epitaxial semiconductor layer is contiguous with the semiconductor-on-insulator layer, to form an integral semiconductor layer, wherein a top surface of the integral semiconductor layer is substantially coplanar with a top surface of the nitride layer, and wherein the integral semiconductor layer encloses a remainder of the blanket oxide layer;
    removing the nitride layer after forming the integral semiconductor layer; and
    performing an anisotropic reactive ion etch on the integral semiconductor layer to split the integral semiconductor layer into an upper set of fins and a lower set of fins.

2. The method of claim 1, wherein growing the epitaxial semiconductor layer comprises growing an epitaxial silicon layer.

3. The method of claim 2, wherein growing the epitaxial silicon layer comprises growing an in-situ doped epitaxial silicon layer.

4. The method of claim 1, wherein forming the blanket oxide layer is performed using a flowable oxide process.

* * * * *